United States Patent
Ishiwata

(10) Patent No.: US 7,883,823 B2
(45) Date of Patent: Feb. 8, 2011

(54) PHOTOMASK AND METHOD FOR MANUFACTURING A SEMICONDUCTOR DEVICE USING THE PHOTOMASK

(75) Inventor: Naoyuki Ishiwata, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 408 days.

(21) Appl. No.: 12/025,250

(22) Filed: Feb. 4, 2008

(65) Prior Publication Data

US 2008/0187843 A1 Aug. 7, 2008

(30) Foreign Application Priority Data

Feb. 2, 2007 (JP) ............... 2007-023642

(51) Int. Cl.
G03F 7/20 (2006.01)
G03F 9/00 (2006.01)
(52) U.S. Cl. .................. 430/22; 430/319; 430/394
(58) Field of Classification Search ............ 430/22
See application file for complete search history.

(56) References Cited

U.S. PATENT DOCUMENTS 5,989,754 A * 11/1999 Chen et al. .............. 430/5

6,291,114 B1 9/2001 Reijers

FOREIGN PATENT DOCUMENTS

| JP | 5-100410 A | 4/1993 |
|---|---|---|
| JP | 2000-131823 A | 5/2000 |
| JP | 2002-532758 A | 10/2002 |

\* cited by examiner

*Primary Examiner*—Mark F Huff
*Assistant Examiner*—John Ruggles
(74) *Attorney, Agent, or Firm*—Westerman, Hattori, Daniels & Adrian, LLP

(57) ABSTRACT

A method of manufacturing a semiconductor device that includes: a first exposing step using a photomask in a first area of a semiconductor substrate; and a second exposing step using the photomask in a second area adjacent to the first area of the semiconductor substrate. The photomask includes a first transmitting pattern having a ring shape that is missing a part, and a supplemental second transmitting pattern having a shape corresponding to the missing part of the first transmitting pattern, so that a closed loop pattern is exposed by the first exposing step and the second exposing step on the semiconductor substrate.

8 Claims, 12 Drawing Sheets

PRIOR ART FIG.1

PHOTOMASK AND METHOD FOR MANUFACTURING A SEMICONDUCTOR DEVICE USING THE PHOTOMASK

CROSS-REFERENCE TO RELATED APPLICATIONS

This application is based upon and claims the benefit of priority from the prior Japanese Patent Application No. 2007-23642 filed on Feb. 2, 2007, the entire contents of which are incorporated herein by reference.

TECHNICAL FIELD

The present invention relates to a photomask used for manufacturing a semiconductor device and a method for manufacturing a semiconductor device using the photomask.

BACKGROUND

As demand for further higher integration of semiconductor devices increases (LSI), additional patterns not directly related to the electronic circuit of a device, such as a moisture resistant ring pattern, that have comparatively loose design rules to those of the integrated circuits must also be miniaturized.

FIG. 1 is a plan view showing an example of a conventional photomask 10 utilized for patterning semiconductor devices. The peripheral and unpatterned areas in the figure depict an opaque region of the photomask which is conventionally formed of a shading film made from metal such as Cr. The patterned parts depicted in the figure is a transparent region that transmits a light for patterning. Moreover, the broken line 11 in the figure is a virtual line equivalent to a scribe line. A semiconductor substrate is cut along the scribe line, and divided into individual chips in the final process of manufacturing a semiconductor device. Therefore, the area inside the broken line 11 means one chip. In FIG. 1, the area inside the broken line 11, equivalent to a scribe line, is the area of a single chip and the area outside of the broken line is a shaded area that is conventionally not patterned.

The photomask 10 of FIG. 1 has a circuit pattern 12 to form an electronic circuit and a moisture resistant ring pattern 13 to form a moisture resistant ring. Moreover, FIG. 1 depicts the circuit pattern 12 schematically by the symbol "F", though an actual photomask has a pattern for forming a wiring or a contact hole as the circuit pattern on the chip.

As further shown in FIG. 1, the wiring, the contact hole, the moisture resistant ring (moisture proof ring), and other patterning are formed by setting the photomask 10 in an exposure device, and printing (transcribing) the circuit pattern 12 and the moisture resistant ring 13 onto the semiconductor substrate. The moisture resistant ring is provided to prevent the incursion of moisture into a completed semiconductor device that is liable to cause a breakdown. Usually, the moisture resistant ring is formed two or threefold as shown in FIG. 1. Moreover, the moisture resistant ring pattern 13 is usually formed with a near identical width as the circuit pattern. This is because, if the width of the moisture resistant ring is significantly larger than the width of the circuit pattern, it generates a phenomenon called loading effect in which the etching speed in the moisture resistant formation part becomes slower than the etching speed in the circuit formation part. As a result, the moisture resistant ring cannot be formed properly. The moisture resistant ring pattern 13 usually has a width of about 0.4 μm in the photomasks used for manufacturing a semiconductor device employing 90-nm design rules.

During the manufacturing process, or when otherwise in use the photomask 10 might be charged with static electricity. When the photomask 10 is carrying a static electric charge, and the inside and the outside of the conventional photomask are electrically separated by the moisture resistant ring pattern 13 as shown in FIG. 1, potential difference might be generated between the inside and the outside of the moisture resistant ring pattern 13. As a result, the moisture resistant ring pattern 13 might be damaged by a static electric discharge.

Therefore, a photomask that can prevent patterns from being damaged by static electricity and a manufacturing method of a semiconductor device by using the photomask are required.

SUMMARY

The photomask according to an aspect of the present invention comprises a chip area and a shaded area. The chip area has a first transmitting pattern with a ring shape that is missing a part and the shaded area has a second transmitting pattern having a shape corresponding to the missing part of the first transmitting pattern.

DESCRIPTION OF THE PREFERRED EMBODIMENTS

Figure 1:
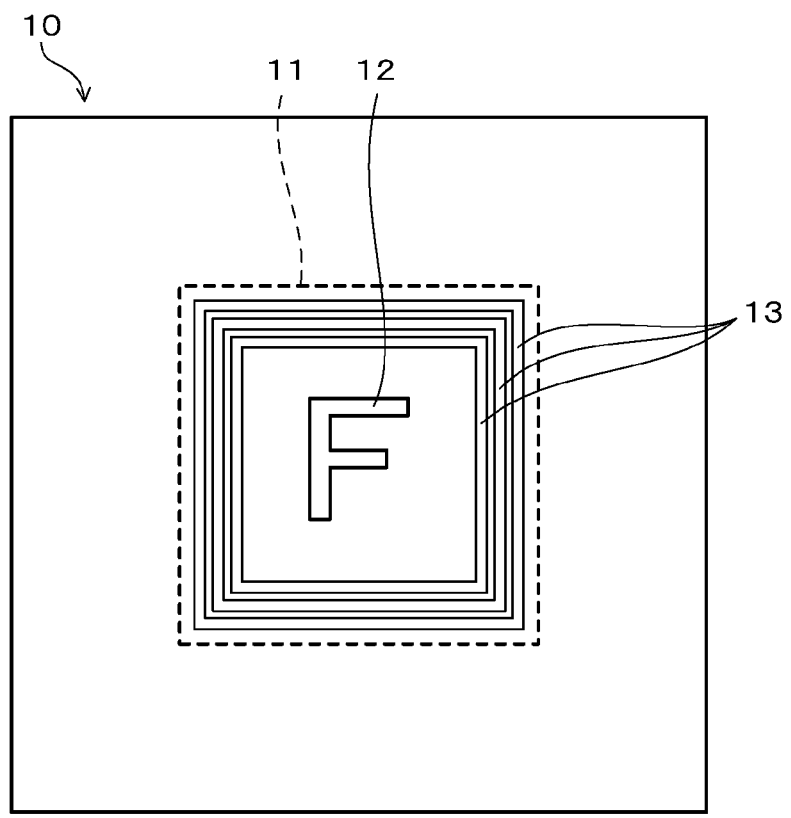
FIG. 1 is a plan view that illustrates an example of a conventional photomask.
Figure 2:
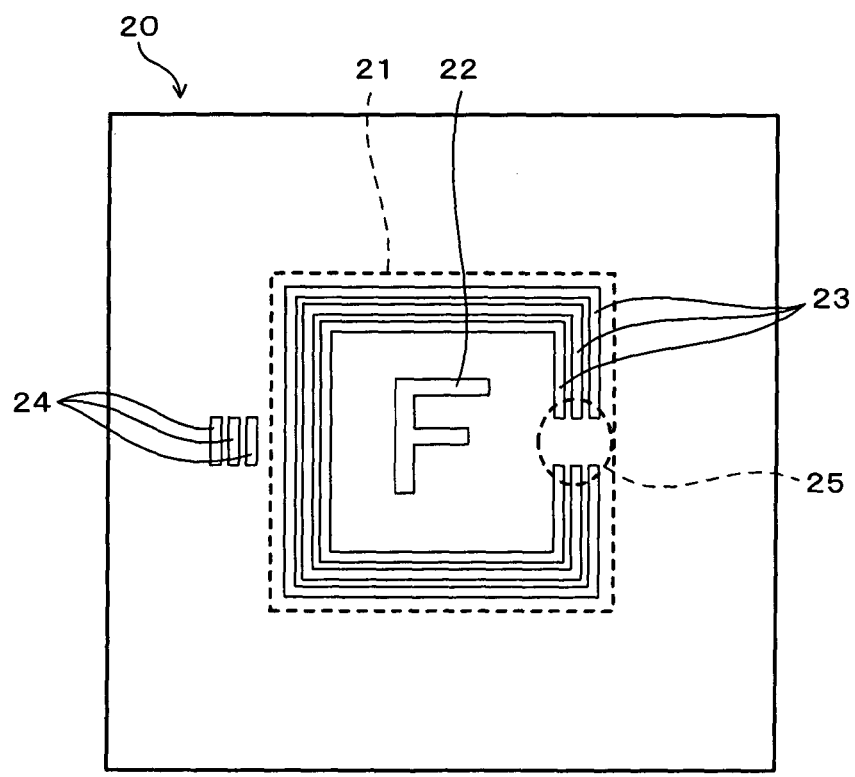
FIG. 2 is a plan view that illustrates a photomask in accordance with the first embodiment of the present invention.

FIG. 2 is a plan view that illustrates a photomask of the first embodiment. This photomask 20 is formed by adhering a shading film such as Cr (chrome) on the surface of a glass substrate, and patterning the shading film by a photolithography method and an etching method. In FIG. 2, the hatched area illustrates a shaded part having a shading film and the white part illustrates a transparent region that transmits a light forming the pattern. Moreover, a broken line 21 in the figure is a virtual line that represents a scribe line to cut a semiconductor substrate, and is hereinafter referred to as the scribe line 21. Herein, the segment inside of the scribe line 21 is called the chip area and the segment outside the scribe line 21 is called the shaded area.

The chip area of the photomask 20 comprises a circuit pattern 22 to form an electronic circuit and a moisture resistant ring pattern 23 to form a moisture resistant ring. FIG. 2 depicts the circuit pattern 22 schematically with the "F" character. The actual photomask is provided with a circuit pattern for forming a wiring or a contact hole.

The moisture resistant ring pattern 23 is formed inside the chip area along the peripheral part of the chip area. In the embodiment, the moisture resistant ring pattern 23 is three encircling rings. However, it is not an essential condition to form the moisture resistant ring pattern 23 with three rings. The moisture resistant ring pattern maybe comprised of one or more rings.

As shown in FIG. 2, each moisture resistant ring pattern 23 has a missing part on the right side of the pattern. This part is encircled with a broken line 25 in the figure, and is hereafter referred to as the missing part 25. Therefore, the shading films inside and outside of each moisture resistant ring pattern 23 are electrically connected via the missing part 25.

Outside of the scribe line 21, on the opposite side of the missing part 25, so as to sandwich the circuit pattern 22 there between, a supplement pattern 24 is formed. The supplemental part 24 consists of three lines equivalent to the missing part 25 of the moisture resistant ring pattern 23. The spaces between the lines of the supplement pattern 24 and the rings of the moisture resistant ring pattern 23 are equivalent in pitch, so that when exposing the patterns on the semiconductor substrate by step-and-repeat exposure the line and ring patterns are matched as described below.

As mentioned above, because the photomask 20 in this embodiment is provided with the missing part 25 in the moisture resistant ring pattern 23, the shading films inside and outside of the moisture resistant ring pattern 23 are electrically connected. Therefore, even when the photomask 20 is charged with static electricity for some reasons, discharge will not occur in a manner that may damage the moisture resistant ring pattern 23. For example, since charge accumulated in the photomask 20 can be easily removed by grounding a part of the shaded area of the photomask 20, problems during inspection by SEM or a repair process by FIB due to the charge accumulated in the photomask 20 are prevented.

Figure 3:
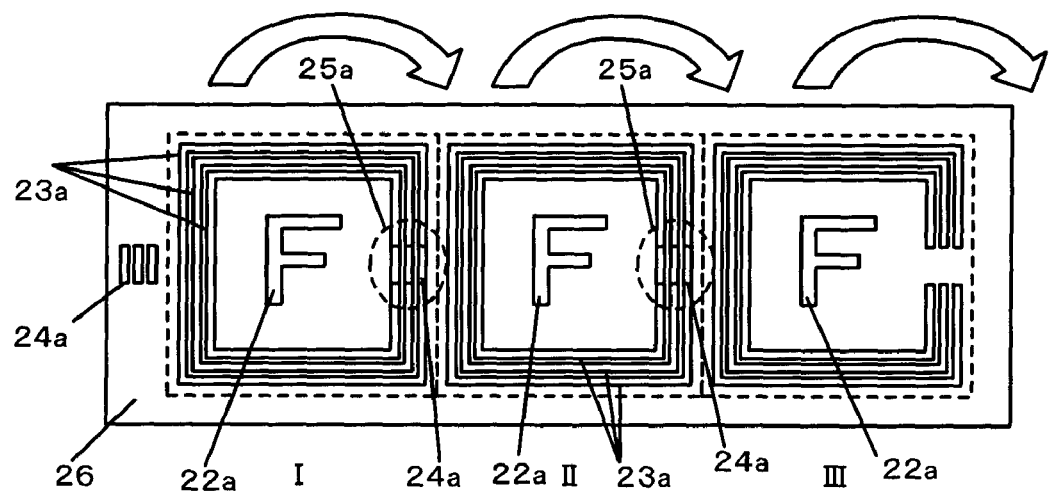
FIG. 3 is a schematic diagram that illustrates a process in which patterns are printed on a photoresist film formed on a semiconductor substrate by using the photomask of FIG. 2.

FIG. 3 is a schematic diagram that illustrates a process in which a pattern according to the first embodiment as set forth in FIG. 2 is printed on a photoresist film 26 formed on a semiconductor substrate using the photomask 20. In FIG. 3, it is assumed that the circuit pattern 22a and the moisture resistant ring pattern 23a are sequentially exposed in the first area I, the second area II and the third area III.

The photomask 20 of this embodiment is set in an exposure device (stepper) and patterns are printed on the photoresist film formed on the semiconductor substrate by a step-and-repeat exposure process. As shown in FIG. 3, in the process where the moisture resistant ring pattern 23a as well as the circuit pattern 22a is printed on the second area II, the supplement pattern 24a is printed on the missing part 25a of the moisture resistant ring pattern 23a printed on the first area I. Namely, when the photomask 20 of this embodiment is used to form repeating exposure patterns on a photoresist with a step-and-repeat exposure process, the moisture resistant ring pattern 23a and supplemental pattern 24a are printed on the photoresist film 26 as a closed ring.

Figures 4A, 4B, 4C:
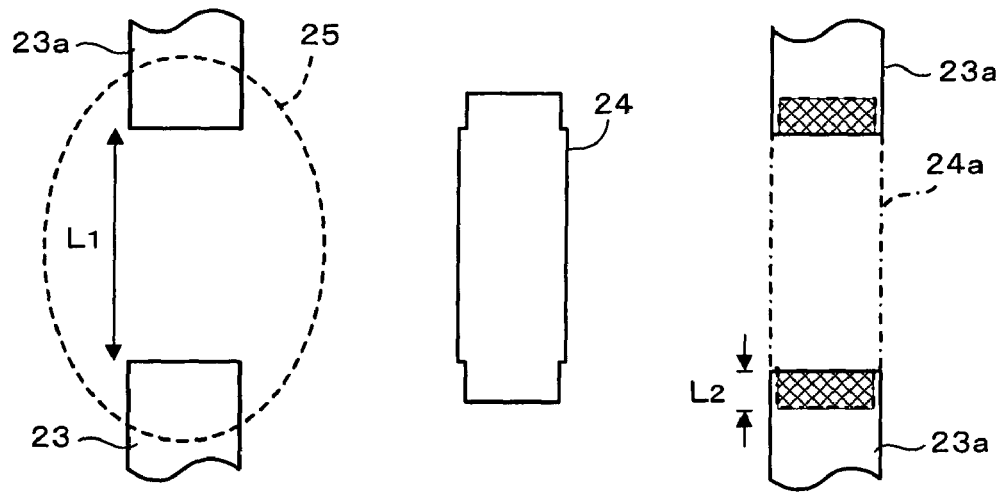
FIGS. 4A to 4C are expanded plan views that illustrate the missing part of the moisture resistant ring pattern of FIG. 2; FIG.

FIG. 4A is an expanded plan view that illustrates the missing part 25 of the moisture resistant ring pattern 23; FIG. 4B is an expanded plan view that illustrates a supplement pattern 24; FIG. 4C is a schematic diagram that illustrates the moisture resistant ring pattern 23a and the supplement pattern 24a printed on the photoresist film 26 on a semiconductor substrate. FIG. 4C shows the supplement pattern 24a printed on the photoresist film by dashed lines and shaded area.

As shown in FIG. 4A, the portion of the moisture resistant ring pattern 23 with the missing part 25 and a part of the moisture resistant ring pattern 23 are depicted. The length L1 of this missing part 25 can be assumed as around 0.1 mm or more and for example, around several mm is preferable.

As shown in FIG. 4C, the supplement pattern 24 is formed with the end parts of the supplement pattern 24a overlapped with the end parts of the moisture resistant ring pattern 23a to some extent. The length L2 of each overlapped part (the hatched part in FIG. 4C) of the moisture resistant ring pattern 23a and the supplement pattern 24a printed on the photoresist film 26 is specified as, for example, around 0.1 µm. In this case, as shown in FIG. 4A to C, it is preferable for either the width of the moisture resistant ring pattern 23 or the width of supplement pattern 24 to be slightly narrower than the other part when they are overlapped. In FIG. 4A to C the supplement pattern 24, 24a overlaps have a narrower width than the moisture resistant ring pattern 23, 23a. In this manner, the widths of overlapped parts are prevented from being thicker than the other parts due to double exposure.

In this embodiment, the supplement pattern 24a is printed on the missing part of the moisture resistant ring pattern 23a by repeating the exposure pattern using a step-and-repeat exposure process to thereby form the closed ring-shaped moisture resistant ring pattern. Therefore, moisture is prevented from invading the circuit formation part of the semiconductor device and the photomask 20 is protected from static electric discharges.

A method for manufacturing a semiconductor device by using the above-described photomask is explained as follows. In FIG. 5A, FIG. 6A, FIG. 7A, FIG. 8A, FIG. 9A, FIG. 10A, and FIG. 11A illustrate the sectional views of the moisture resistant ring formation areas, and FIG. 5B, FIG. 6B, FIG. 7B, FIG. 8B, FIG. 9B, FIG. 10B, and FIG. 11B illustrate the sectional views of the electronic circuit formation areas (n-type transistor formation areas and p-type transistor formation areas).

Figure 5B:
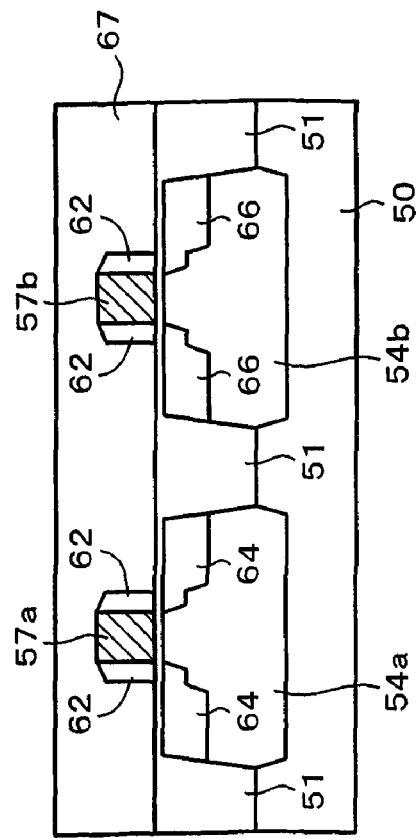
FIGS. 5A and 5B are sectional views that illustrate a manufacturing method of a semiconductor device by using the photomask of FIG. 2.
Figure 5A:
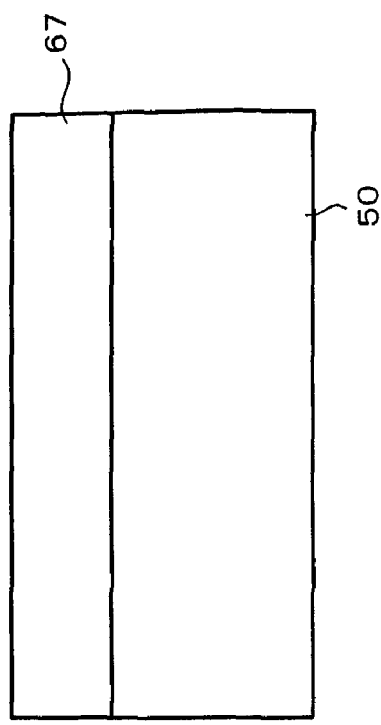

First, by a well-know method, as shown in FIGS. 5A and 5B, an n-type transistor and a p-type transistor are formed in the electronic circuit formation area of semiconductor substrate (silicon substrate) 50. An insulating material such as $SiO_2$ is accumulated over the semiconductor substrate 50, and a first inter layer dielectric 67 is thereby formed so as to cover the n-type transistor and p-type transistor. Afterwards, the surface of the first inter layer dielectric 67 is polish and planarize by a chemical mechanical polishing method (CMP).

FIG. 5B further depicts an element isolation film 51 that separates each element area. A p-well 54a, a p-well 54b, a gate electrode 57a of n-type transistor, a gate electrode of p-type transistor 57b, a side wall insulating film 62, a n-type high concentration impurity substance area 64 (source/drain of n-type transistor) and a p-type high concentration impurity substance area 66 (source/drain of p-type transistor) are formed in the element areas. All of which may be formed by well known methods in the art.

Figure 6B:
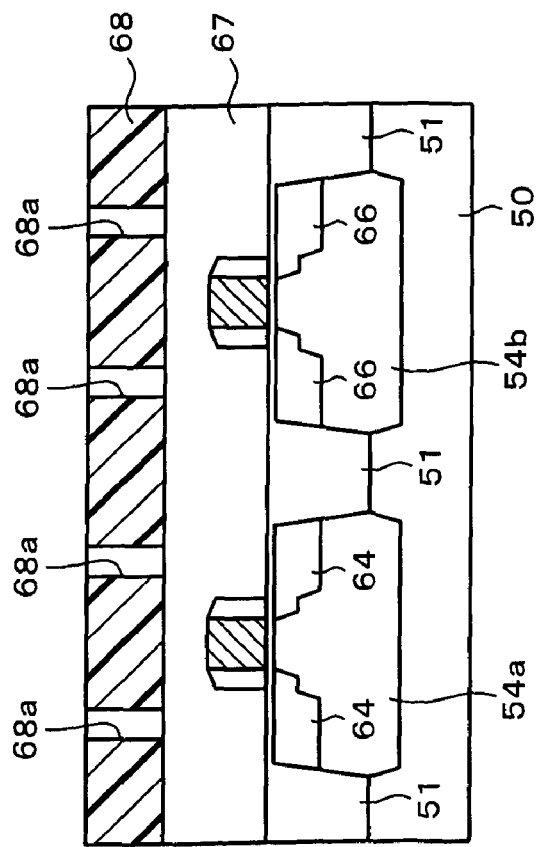
FIGS. 6A and 6B are sectional views that illustrate a manufacturing method of a semiconductor device by using the photomask of FIG. 2.
Figure 6A:
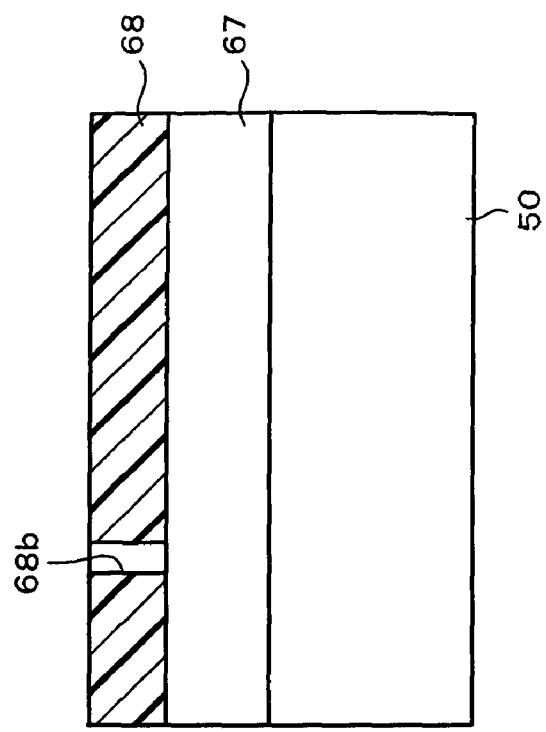

As shown in FIGS. 6A and 6B, a photoresist film 68 is formed on the first inter layer dielectric 67. A photomask, as shown in FIG. 2, is used to form a given circuit pattern (a pattern to form a contact hole), the moisture resistant ring pattern and the supplement pattern, by performing a step-and-repeat exposure process as shown in FIG. 3. Afterwards, an opening 68a is formed on the photoresist film 68 in the electronic circuit formation area and an opening 68b is formed in the photoresist film 68 in the moisture resistant ring formation area by developing the photoresist film 68.

Figure 7B:
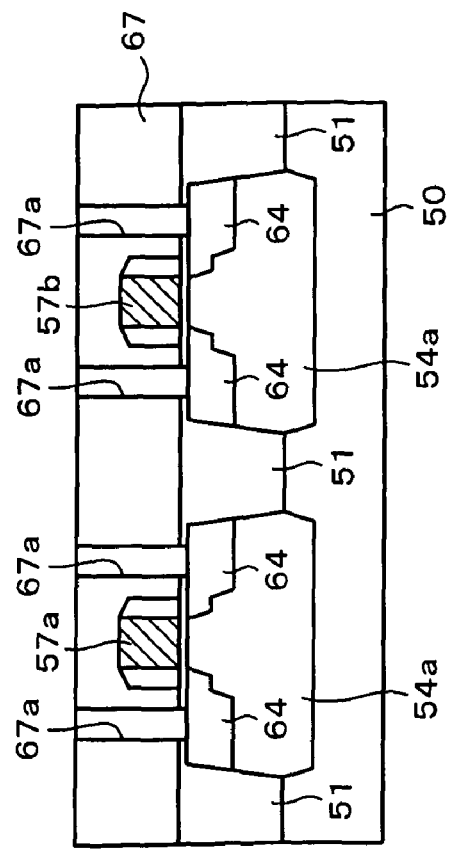
FIGS. 7A and 7B are sectional views that illustrate a manufacturing method of a semiconductor device by using the photomask of FIG. 2.
Figure 7A:
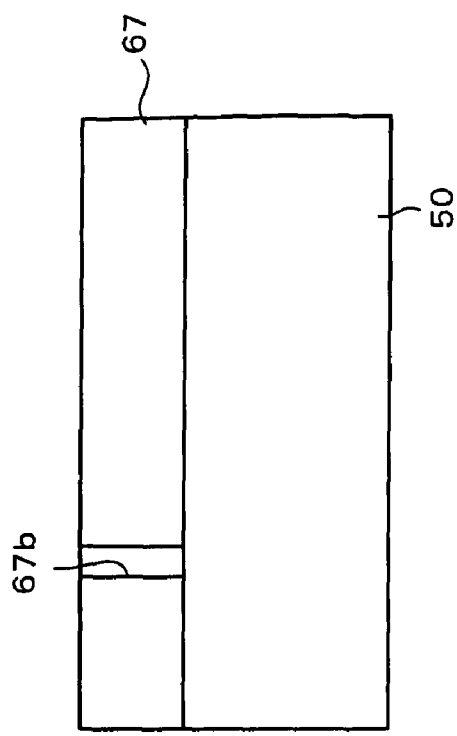

Next, by using this photoresist film 68 as an etching mask the first inter layer dielectric 67 is etched. As shown in FIG. 7A and 7B, a contact hole 67a is formed on the upper surface of the inter layer dielectric 67 in the electronic circuit formation area as the contact hole 67a to reach the n-type high concentration impurity substance area 64 and the p-type high concentration impurity substance area 66. Concurrently an opening 67b is formed in the upper surface of the inter layer dielectric 67 in the moisture resistant ring formation area as the opening 67b to reach the semiconductor substrate 50. Afterwards, the photoresist film 68 is removed.

Figure 8B:
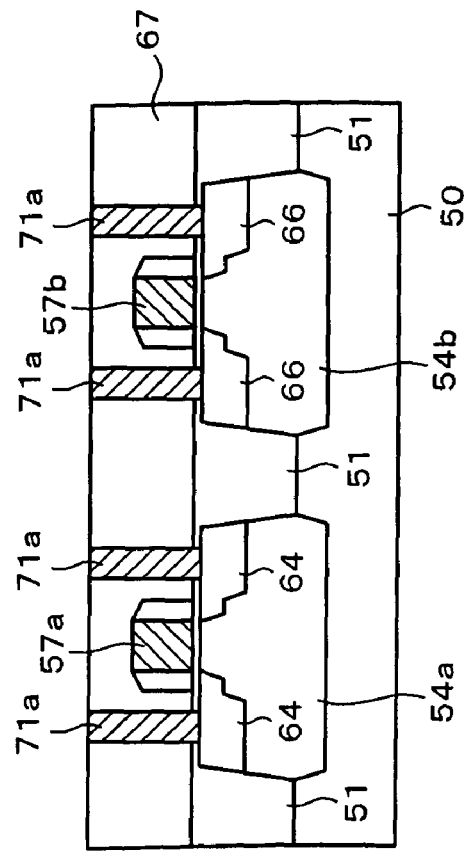
FIGS. 8A and 8B are sectional views that illustrate a manufacturing method of a semiconductor device by using the photomask of FIG. 2.
Figure 8A:
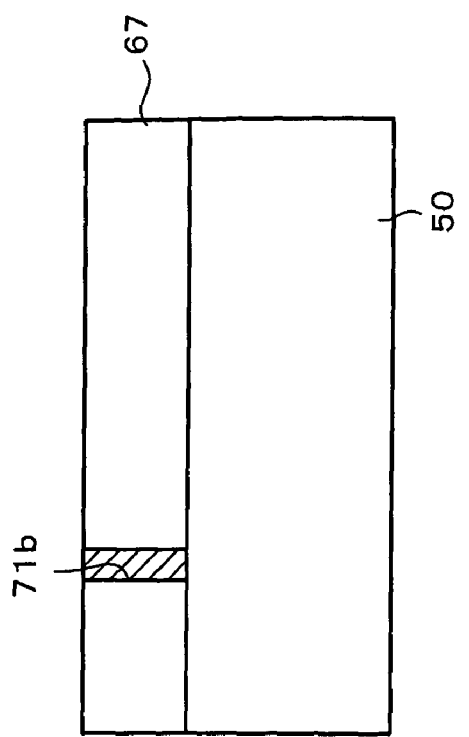

Next, a TiN film (not shown in a figure) is formed as a barrier layer on the entire upper side of the semiconductor substrate 50. Then, a W (tungsten) film (not shown in a figure) is formed by accumulating W on the TiN film and W is filled into the contact hole 67a and the opening 67b. Next, the W film is polished by the CMP method until the inter layer dielectric 67 is exposed. In this manner, as shown in FIGS. 8A and 8B, a W plug 71a and a first moisture resistant ring 71b are formed.

Figure 9B:
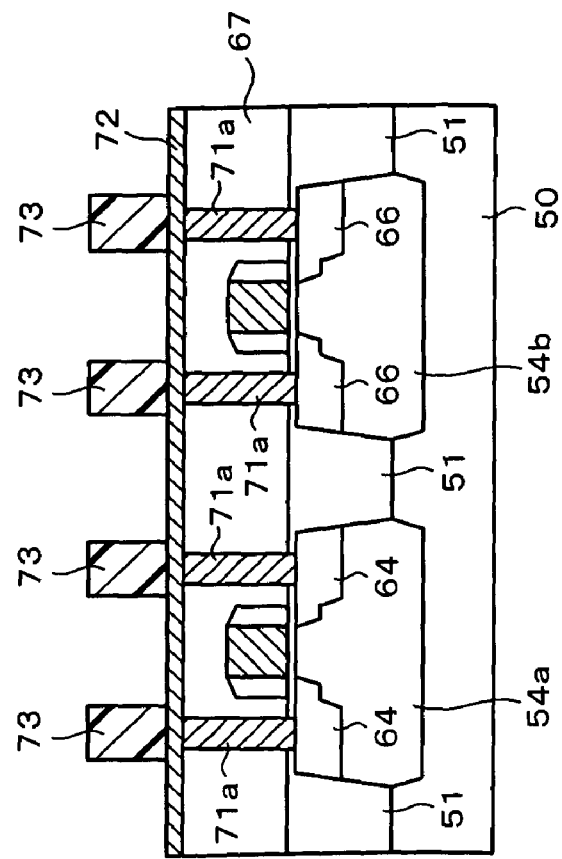
FIGS. 9A and 9B are sectional views that illustrate a manufacturing method of a semiconductor device by using the photomask of FIG. 2.
Figure 9A:
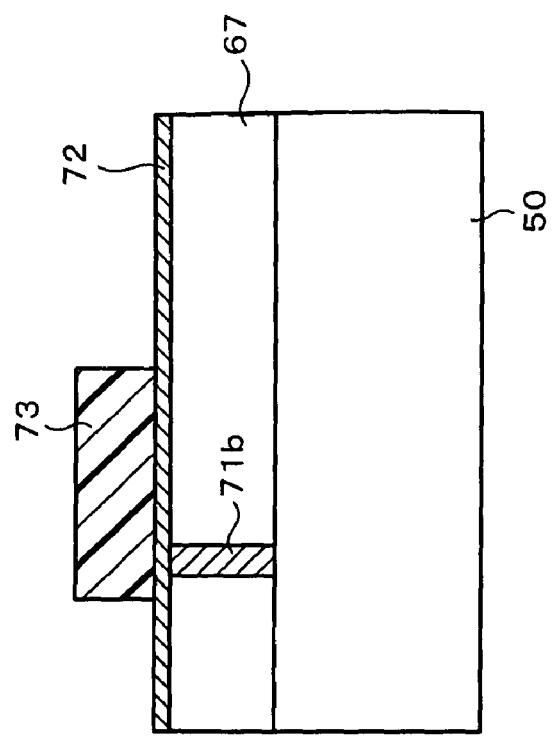

Next, as shown in FIGS. 9A and 9B, a conductive film 72 having a laminated structure for example, such as TiN/Al/TiN is formed over the entire upper side of the semiconductor substrate 50. Afterwards, a photoresist film 73 is formed over the entire upper side of the conductive film 72. A photomask, as shown in FIG. 2, and provided with a given circuit pattern (a pattern to form a wiring), the moisture resistant ring pattern and the supplement pattern, is utilized in a step-and-repeat exposure process as shown in FIG. 3. Afterwards, a processing procedure is performed, and as shown in FIGS. 9A and 9B, the photoresist film 73 is left only in a given area.

Figure 10B:
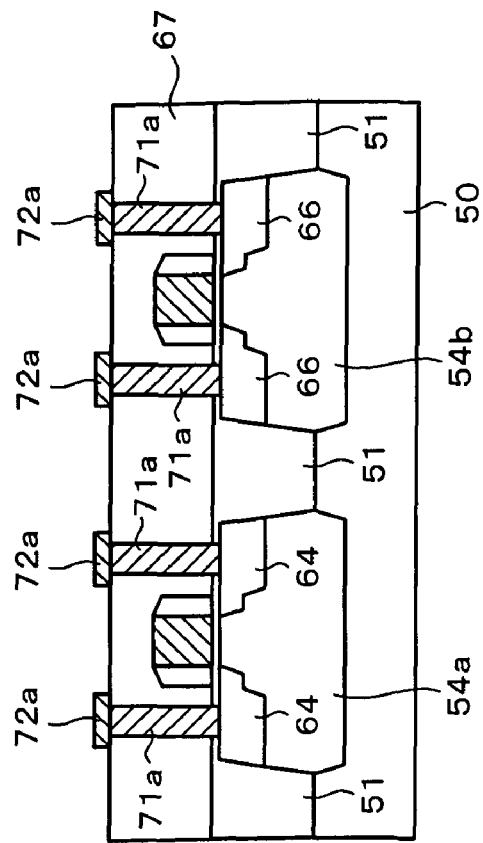
FIGS. 10A and 10B are sectional views that illustrate a manufacturing method of a semiconductor device by using the photomask of FIG. 2.
Figure 10A:
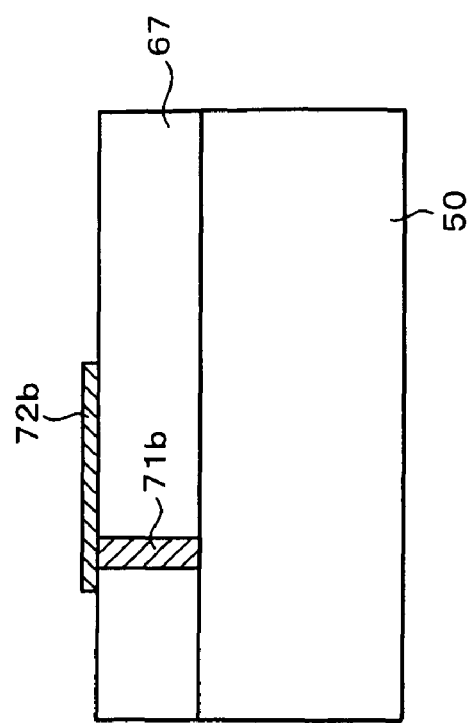
Figure 11B:
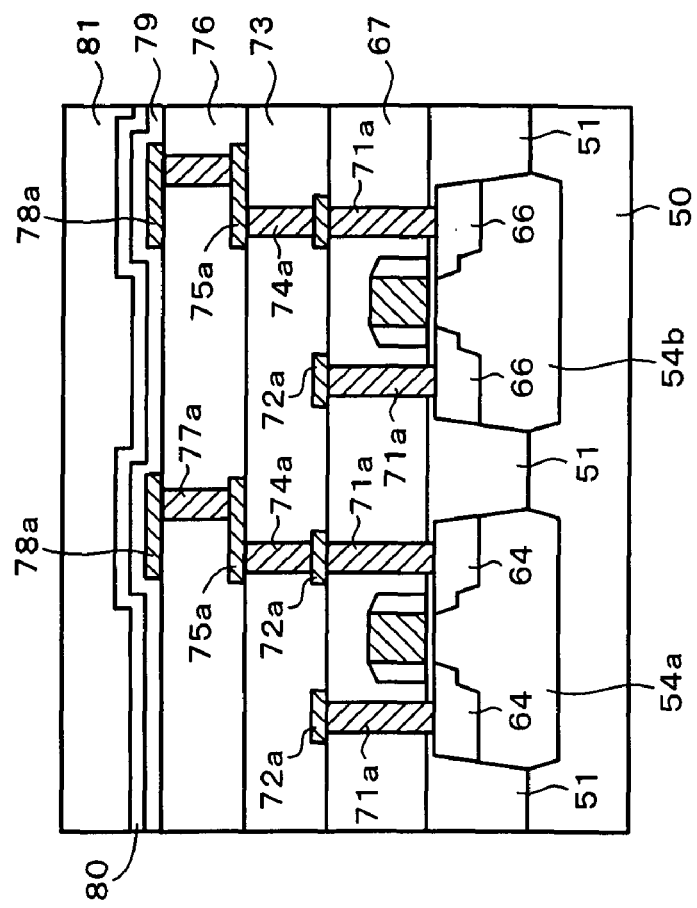
FIGS. 11A and 11B are sectional views that illustrate a manufacturing method of a semiconductor device by using the photomask of FIG. 2.
Figure 11A:
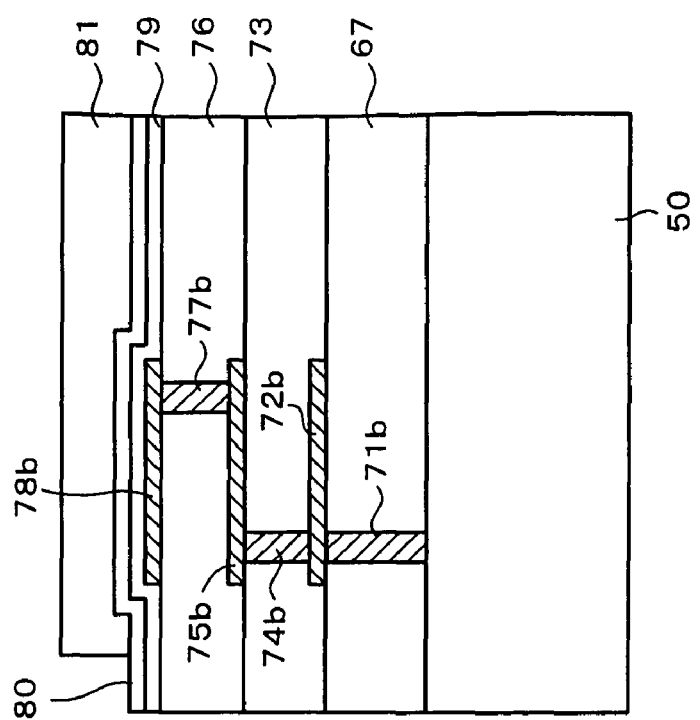

Next, the conductive film 72 with this photoresist film 73 as a mask is etched, and as shown in FIGS. 10A and 10B, a wiring 72a of a given pattern is formed in the electronic circuit formation area and a second moisture resistant ring 72b is formed in the moisture resistant formation area.

Next, using a similar method as that mentioned above to form the first inter layer dielectric 67, the moisture resistant ring 71b and the moisture resistant ring 72b, as shown in FIG. 11, a second inter layer dielectric 73, a W plug 74a, a third moisture resistant ring 74b, a wiring 75a, a fourth moisture resistant ring 75b, a third inter layer dielectric 76, a W plug 77a, a fifth moisture resistant ring 77b, a wiring 78a and a sixth moisture resistant ring 78b are formed. Then, a silicon oxide film 79 and a silicon nitride film 80 are formed sequentially over the third inter layer dielectric 76, the wiring 78a and the sixth moisture resistant ring 78b. In addition, a protection film 81 comprising polyimide, etc. is formed over the silicon oxide film 79 and the silicon nitride film 80. Afterwards, the semiconductor 50 is cut along the scribe line and divided into individual chip. In this way, a semiconductor device is completed.

The semiconductor device manufactured by this embodiment can prevent moisture from invading to the electronic circuit formation area because the moisture resistant rings (the moisture resistant rings 71b, 72b, 74b, 75b, 77b and 78b) surround the electronic circuit formation area. This has an effect on improving the reliability of the semiconductor device.

As shown in FIG. 2, this embodiment uses the photomask 20 comprising the moisture resistant pattern 23 including a missing part 25 and the supplement pattern 24 equivalent to the missing part 25, so that the pattern of the photomask 20 is protected from damage which may result from static electric build up on the photomask 20. In addition, since exposure is performed by using the above-mentioned photomask in a step-and-repeat exposure process, a circularly closed moisture resistant ring is formed on the semiconductor substrate 50.

Moreover, in the above-mentioned embodiment, the moisture resistant rings are formed on all the inter layer dielectrics and all the wiring layers, however, the moisture resistant rings can be omitted on the part where there is no possibility of moisture invasion.

The inventors of the present application manufactured the photomask of this embodiment and manufactured the semiconductor device by the above-mentioned method utilizing the following criteria. As an exposure device, a reduction projection exposure device (stepper) with an ArF excimer laser as the exposure light source was used. Moreover, the light-exposure conditions were 0.70 aperture rate (NA), 0.70 σ value, and 470 J/cm$^2$ exposure dosage. The moisture resistant ring was formed by performing development processing and etching processing after performing step-and-repeat exposure under the above conditions. Then, the semiconductor substrate including this moisture resistant ring was inspected by using a wafer pattern inspection system (KLA2350 manufactured by KLA). As a result, it was confirmed that the moisture resistant ring was properly formed.

Figure 12:
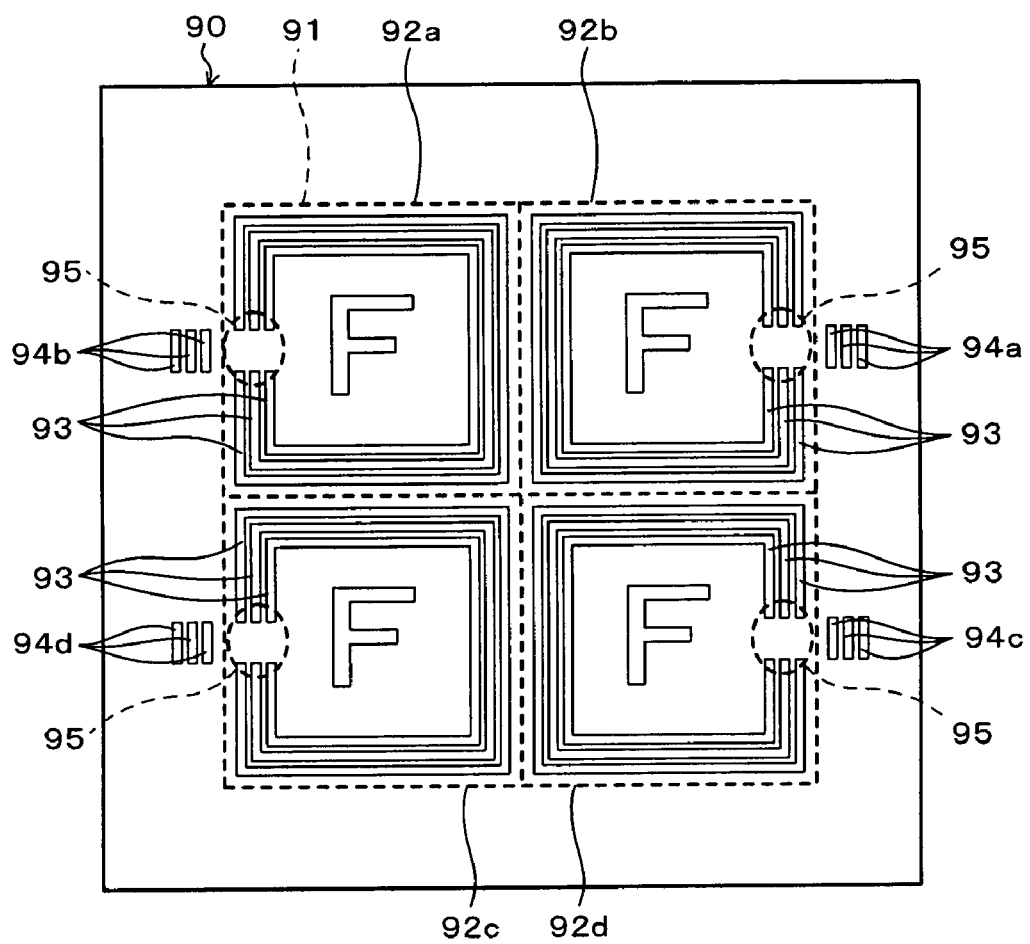
FIG. 12 is a plan view that illustrates a photomask in accordance with a second embodiment of the present invention.
Figure 13:
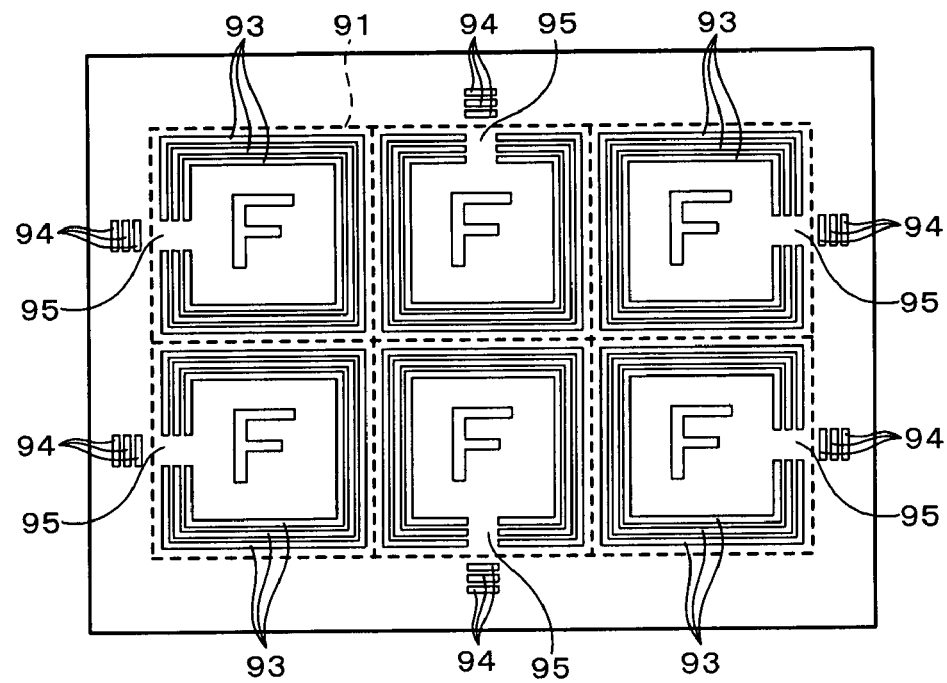
FIG. 13 is a plan view that illustrates a photomask in accordance with a third embodiment of the present invention.
Figure 14:
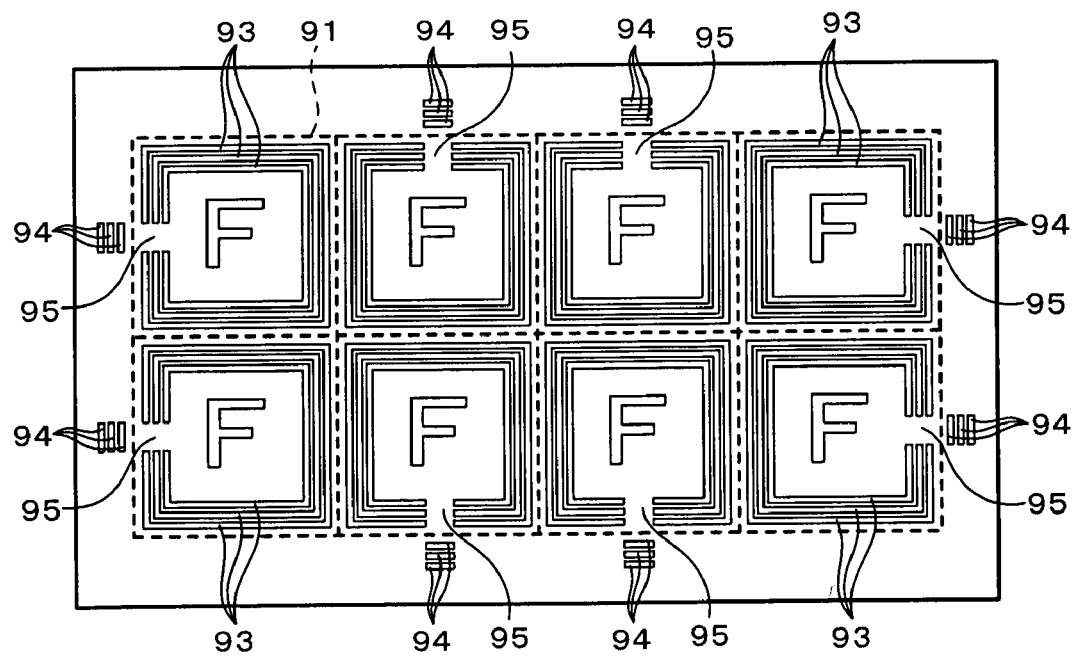
FIG. 14 is a plan view that illustrates a photomask in accordance with a fourth embodiment of the present invention.

FIG. 12 illustrates a plan view of a photomask of a second embodiment. The first embodiment above explains the case where patterns for single chip are formed on a single photomask. The second embodiment encompasses the circumstances where patterns for four chips are formed on a single photomask 90. Moreover, the broken line 91 in FIGS. 12-14 is a virtual line equivalent to a scribe line.

On the photomask 90 of the second embodiment, as shown in FIG. 12, patterns for two chips vertically and for two chips horizontally are formed. Here, each area of the four chips is called the first chip area 92a, the second chip area 92b, the third chip area 92c and the fourth chip area 92d. Each chip area from 92a to 92d is provided with a pattern to form a circuit (schematically shown by F in FIG. 12) and a moisture resistant ring pattern 93 to form a moisture resistant ring. However, the moisture resistant ring pattern 93 of each chip area is provided with a missing part 95 just as in the first embodiment, and a shading film (metal film) inside the moisture resistant ring pattern 93 and a shading film outside of the moisture resistant ring pattern 93 are electrically connected through this missing part 95.

The shaded area on the left side of the first chip area 92a is provided with the supplement pattern 94b equivalent to the missing part 95 of the moisture ring pattern 93 of the second chip area 92b. The shaded area on the right side of the second chip area 92b is provided with the supplement pattern 94a equivalent to the missing part 95 of the moisture ring pattern 93 of the first chip area 92a. The shaded area on the left side of the third chip area 92c is provided with the supplement pattern 94d equivalent to the missing part 95 of the moisture ring pattern 93 of the fourth chip area 92d. The shaded area on the right side of the fourth chip area 92d is provided with the supplement pattern 94c equivalent to the missing part 95 of the moisture ring pattern 93 of the third chip area 92c.

As for the photomask 90 of this embodiment, it is also possible to print the closed ring-shaped moisture resistant ring pattern on the photoresist film formed on the semiconductor substrate utilizing a step-and-repeat exposure process.

FIGS. 13 and 14 are plan views that show variations of the second embodiment. Regarding the photomask shown in FIG. 13, patterns for six chips are formed on the single photomask. Regarding the photomask shown in FIG. 14, patterns for eight chips are formed on the single photomask. These photomasks are also provided with the missing part 95 of the moisture resistant ring pattern 93 in each chip area and with the supplement pattern 94 in the shaded area corresponding to the missing part 95 of the moisture resistant ring pattern 93 in each chip area.

As for these photomasks, it is also possible to print the closed ring-shaped moisture resistant ring pattern on the photoresist film formed on the semiconductor substrate by horizontally and vertically exposing with a step-and-repeat exposure process.

The above-mentioned two embodiments can also be applied to an attenuated phase shift mask comprising a light-semi-transmissive area and an alternating phase shift mask comprising a phase shifter that controls the phase of a transmitted light.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method of manufacturing a semiconductor device, comprising:
    a first exposing step using a photomask in a first area of a semiconductor substrate; and
    a second exposing step using the photomask in a second area adjacent to the first area of the semiconductor substrate;
    wherein the photomask comprises a first transmitting pattern having a ring shape that is missing a part, and a supplemental second transmitting pattern having a shape corresponding to the missing part of the first transmitting pattern; and
    a closed loop pattern is exposed by the first exposing step and the second exposing step on the semiconductor substrate.

2. The method of manufacturing a semiconductor device according to claim 1, wherein a distance on the photomask between the missing part of the first transmitting pattern and the supplemental second transmitting pattern is equivalent to a pitch of a step-and-repeat exposure process.

3. The method of manufacturing a semiconductor device according to claim 1, wherein a length on the photomask of the supplemental second transmitting pattern is longer than a length of the missing part of the first transmitting pattern.

4. The method of manufacturing a semiconductor device according to claim 1, wherein a width of an end part of either the first transmitting pattern or the supplemental second transmitting pattern is narrower than a width of an end part for the other of these patterns.

5. The method of manufacturing a semiconductor device according to claim 1, wherein both the first transmitting pattern and the supplemental second transmitting pattern are patterns for forming a moisture proof ring.

6. The method of manufacturing a semiconductor device according to claim 1, wherein the first transmitting pattern comprises a circuit pattern for an electronic circuit.

7. The method of manufacturing a semiconductor device according to claim 6, wherein the circuit pattern is a pattern for a contact hole or a wiring.

8. The method of manufacturing a semiconductor device according to claim 1, wherein the photomask includes plural chip areas and each chip area is provided with the first transmitting pattern.

* * * * *